(12) United States Patent
Bahlawane

(10) Patent No.: US 12,024,635 B2
(45) Date of Patent: Jul. 2, 2024

(54) CARBON-NANOTUBE-BASED COMPOSITE COATING AND PRODUCTION METHOD THEREOF

(71) Applicant: Luxembourg Institute of Science and Technology (LIST), Esch sur Alzette (LU)

(72) Inventor: Naoufal Bahlawane, Belvaux (LU)

(73) Assignee: LUXEMBOURG INSTITUTE OF SCIENCE AND TECHNOLOGY (LIST), Esch sur Alzette (LU)

(*) Notice: Subject to any disclaimer, the term of this patent is extended or adjusted under 35 U.S.C. 154(b) by 93 days.

(21) Appl. No.: 17/710,087

(22) Filed: Mar. 31, 2022

(65) Prior Publication Data
US 2022/0220317 A1    Jul. 14, 2022

Related U.S. Application Data

(63) Continuation of application No. 15/739,486, filed as application No. PCT/EP2016/065016 on Jun. 28, 2016, now abandoned.

(30) Foreign Application Priority Data

Jun. 29, 2015 (LU) .......................... 92758

(51) Int. Cl.
*C09D 1/00* (2006.01)
*C01B 32/16* (2017.01)
(Continued)

(52) U.S. Cl.
CPC ............. *C09D 1/00* (2013.01); *C01B 32/16* (2017.08); *C01B 32/162* (2017.08);
(Continued)

(58) Field of Classification Search
None
See application file for complete search history.

(56) References Cited

U.S. PATENT DOCUMENTS 6,911,260 B2 * 6/2005 Ren .................. C01B 32/168
428/323
2003/0122111 A1  7/2003 Glatkowski
(Continued)

FOREIGN PATENT DOCUMENTS

CA    2887900 A1    4/2014
CN    1676244 A     10/2005
(Continued)

OTHER PUBLICATIONS

Han et al., "Coating Single-Walled Carbon Nanotubes with Tin Oxide", Apr. 2, 2003, Nano Letters, vol. 3, pp. 681-683 (Year: 2003).*
(Continued)

*Primary Examiner* — Seth Dumbris
(74) *Attorney, Agent, or Firm* — CANTOR COLBURN LLP

(57) ABSTRACT

A first aspect of the invention relates to a carbon-nanotube-based composite coating, comprising a layer of carbon nanotubes (CNTs) that comprise metal oxide claddings sheathing them. Another aspect of the invention relates to a method for producing such CNT-based composite coatings using chemical vapour deposition (CVD).

19 Claims, 8 Drawing Sheets

(51) Int. Cl.
| | |
|---|---|
| C01B 32/162 | (2017.01) |
| C01B 32/168 | (2017.01) |
| C09D 7/40 | (2018.01) |
| C09D 7/62 | (2018.01) |
| C23C 16/26 | (2006.01) |
| C23C 16/40 | (2006.01) |
| C23C 16/448 | (2006.01) |
| C23C 16/455 | (2006.01) |
| B82Y 30/00 | (2011.01) |
| B82Y 40/00 | (2011.01) |

(52) U.S. Cl.
CPC .............. *C01B 32/168* (2017.08); *C09D 7/62* (2018.01); *C09D 7/70* (2018.01); *C23C 16/26* (2013.01); *C23C 16/403* (2013.01); *C23C 16/4486* (2013.01); *C23C 16/45523* (2013.01); *B82Y 30/00* (2013.01); *B82Y 40/00* (2013.01); *C01B 2202/36* (2013.01); *Y10S 977/745* (2013.01); *Y10S 977/843* (2013.01); *Y10S 977/847* (2013.01)

(56) References Cited

U.S. PATENT DOCUMENTS

| | | | |
|---|---|---|---|
| 2006/0043649 | A1 | 3/2006 | Ren et al. |
| 2008/0242785 | A1* | 10/2008 | Ma .......................... C08K 9/02 428/34.1 |
| 2008/0271606 | A1* | 11/2008 | Holmes ................... B01D 53/02 96/132 |
| 2009/0175757 | A1* | 7/2009 | Yao ........................ C04B 35/80 422/23 |
| 2011/0097512 | A1* | 4/2011 | Zhou ........................ H01B 1/04 977/932 |
| 2011/0186775 | A1 | 8/2011 | Shah et al. |
| 2013/0065050 | A1* | 3/2013 | Chen .................. C23C 18/1216 205/159 |
| 2018/0179391 | A1 | 6/2018 | Bahlawane |

FOREIGN PATENT DOCUMENTS

| | | |
|---|---|---|
| DE | 102006033037 A1 | 1/2008 |
| WO | 2010144161 A2 | 12/2010 |
| WO | WO-2013164577 A1 * | 11/2013 ............. H01G 11/04 |
| WO | 2015061383 A1 | 4/2015 |
| WO | 2017001406 A2 | 1/2017 |

OTHER PUBLICATIONS

Nerushev et al., "Carbon nanotube films obtained by thermal chemical vapour deposition", Mar. 2001, J. Mater. Chem., vol. 11, pp. 1122-1132 (Year: 2001).*

Bahlawane et al.; "Catalytically Enhanced H2-Free CVD of Transition Metals Using Commercially Available Precursors"; Surface & Coatings Technology; vol. 201; 2007; pp. 8914-8918.

Bahlawane et al.; "Self Catalyzed Chemical Vapor Deposition Method for Growth of Device-Quality Metal Thin Films"; Microelectronic Engineering; vol. 84; 2007; pp. 2481-2485.

International Search Report Issued in International Application No. PCT/EP2016/065016 dated Mar. 21, 2017; 6 Pages.

Omidvar et al.; "A Method for Coating Carbon Nanotubes with Titanium"; New Carbon Materials; vol. 27, No. 6; 2012; pp. 401-408.

Persky; "Review of Black Surfaces for Space-Borne Infrared Systems"; Review of Scientific Instruments; vol. 7, No. 5; 1999; pp. 2193-2217.

Premkumar et al.; "CVD of Metals Using Alcohols and Metal Acetylacetonates, Part I: Optimization of Process Parameters and Electrical Characterization of Synthesized Films"; Chem. Vap. Deposition; vol. 13; 2007; pp. 219-229.

Premkumar et al.; "CVD of Metals Using Alcohols and Metal Acetylacetonates, Part II: Role of Solvent and Characterization of Metal Films Made by Pulsed Spray Evaporation CVD"; Chem. Vap. Deposition; vol. 13; 2007; pp. 227-231.

Premkumar et al.; "Effect of Solvent on the Growth of Co and Co2C Using Pulsed-Spray Evaporation Chemical Vapor Deposition"; Chem. Mater; vol. 19; 2007; pp. 6206-6211.

Uddin et al.; "Self-Aligned Carbon Nanotubes Yarns (CNY) with Efficient Optoelectronic Interface for Microyarn Shaped 3D Photovoltaic Cells"; vol. 115; 2013; pp. 166-171.

Written Opinion Issued in International Application No. PCT/EP2016/065016 mailed Mar. 21, 2017; 9 Pages.

Yi et al.; "Preparation of Aluminum Oxide-Coated Carbon Nanotubes and the Properties of Composite Epoxy Coatings Research"; High Performace Polymers; vol. 26, No. 3; 2014; pp. 255-264.

* cited by examiner

CARBON-NANOTUBE-BASED COMPOSITE COATING AND PRODUCTION METHOD THEREOF

CROSS-REFERENCE TO RELATED APPLICATIONS

This application is a continuation of U.S. application Ser. No. 15/739,486, filed Dec. 22, 2017, which is a 371 of International Application No. PCT/EP2016/065016, filed Jun. 28, 2016, which claims the benefit of Luxembourg Application No. 92758, filed Jun. 29, 2015, the disclosures of which are incorporated herein by reference in their entirety.

FIELD OF THE INVENTION

The invention generally relates to a novel carbon nanotube (CNT) based composite coating and a method for producing such a coating. A particularly interesting aspect of the invention relates to a black coating made of a CNT-based coating.

BACKGROUND OF THE INVENTION

The performance of certain optical devices strongly depends on the ability of avoiding and/or eliminating stray light. Stray light reduction is an important issue especially in space-borne astronomical instruments, where it may notably affect both the geometric and the radiometric image quality. To prevent light originating from outside the desired field of view of the instrument, baffles are typically arranged around the optical axis. Such baffles are usually cylindrical or conical and may comprise vanes on their interior walls in order to trap as much stray light as possible. In such systems, the absorptance of undesired off-axis radiation in the spectral range of the detector should be as close as possible to 100% irrespective of the incidence angle. Furthermore, the reflectance of the surfaces should ideally be Lambertian. Black coatings have been developed to cover all mechanical surfaces close to the optical beam. An overview can be found in: M. J. Persky, «Review of black surfaces for space-borne infrared systems»Review of scientific instruments, vol. 70, no 5, p. 2193-2217, 1999. Historically, in most spatial missions, black surfaces were obtained using paints (e.g. Aeroglaze™ from Lord Corporation, DeSoto™ Flat Black from Pacific Western Paints, etc.) or anodizations (e.g. Martin Black™, Enhanced Martin Black™, or Infrablack™ from Martin Marietta Corporation, etc.). Other advanced optically black diffuse surfaces such as plasma sprayed boron-on-beryllium, plasma sprayed boron carbide-on-silicon carbide and plasma sprayed beryllium-on-beryllium have been developed. These are diffuse absorptive surfaces that employ microscopic structures to absorb, scatter or trap light. Other black surfaces can be obtained by electrodeposition (e.g. black chrome, black cobalt) or by electroless nickel coating. In the $21^{st}$ century, several advanced coatings have been developed by various companies. Acktar's inorganic coatings (Nano Black™, Magic Black™, Vacuum Black™, Fractal Black™ and Ultra Black™) are fabricated using vacuum deposition technology and feature very low reflectance, high thermal stability, excellent adhesion, and low outgassing. Surrey NanoSystems have developed a super-black material (called Vantablack™) that absorbs 99.96% of surface light. Vantablack™ is produced using a low-temperature carbon nanotube (CNT) growth process. When light strikes the layer of CNTs, instead of bouncing off it is trapped between the tubes before eventually becoming heat. Titanium and silicon substrates have been used to demonstrate the efficiency.

Apart from optical instruments, black materials, in particular black coatings, have applications in passive thermal management (requiring high emissivity), solar energy harvesting (e.g. solar water heating, concentrated solar power generation, etc.), infrared sensing (e.g. in MEMS IR sensors), thermal actuation (e.g. in MEMS thermal actuators), etc.

It is an object of an aspect of the present invention to provide a CNT-based composite coating that may serve as a black coating. More generally, however, it is an object of the invention to provide a new type of coating. The new type of coating could, e.g., be used in the field of energy storage (e.g. in lithium ion batteries or super-capacitors).

Aspects of the methods used in the context of the present invention have been developed from earlier works in which the inventor contributed. The interested reader is referred to (1) Bahlawane N, Premkumar P A, Onwuka K, Reiss G, Kohse-Hoinghaus K. Self-catalyzed chemical vapor deposition method for the growth of device-quality metal thin films. Microelectronic Engineering. 2007; 84(11):2481-2485; (2) Bahlawane N, Premkumar P A, Onwuka K, Rott K, Reiss G, Kohse-Hoinghaus K. Catalytically enhanced Hz-free CVD of transition metals using commercially available precursors. Surface & Coatings Technology. 2007; 201(22-23):8914-8918; (3) Premkumar P A, Bahlawane N, Kohse-Hoinghaus K. CVD of metals using alcohols and metal acetylacetonates, Part I: Optimization of process parameters and electrical characterization of synthesized films. Chemical Vapor Deposition. 2007; 13(5):219-226; (4) Premkumar P A, Bahlawane N, Reiss G, Kohse-Hoinghaus K. CVD of metals using alcohols and metal acetylacetonates, Part II: Role of solvent and characterization of metal films made by pulsed spray evaporation CVD. Chemical Vapor Deposition. 2007; 13(5):227-231; (5) Premkumar P A, Turchanin A, Bahlawane N. Effect of solvent on the growth of Co and $Co_2C$ using pulsed-spray evaporation chemical vapor deposition. Chemistry of Materials. 2007; 19(25):6206-6211; and (6) German patent application DE 10 2006 033 037 A1, disclosing a one-step method for depositing a metal onto a substrate by means of a gas phase deposition method. According to DE 10 2006 033 037 A1, a metal-containing precursor compound is dissolved in an organic solvent, which serves as a reducing agent that releases the metal species from the metalorganic precursor.

General Description

A first aspect of the invention relates to a carbon-nanotube-based composite coating, comprising a layer of carbon nanotubes, which is characterized in that the carbon nanotubes comprise metal oxide claddings that sheathe the carbon nanotubes. The metal oxide claddings are preferably transparent and conformal with the CNTs. They may sheathe the carbon nanotubes on their full lengths or along sections thereof. The carbon-nanotube-based composite coating is typically porous. However, the pores or interstices between the metal-oxide-coated CNTs may be more or less filled with metal oxide or other material(s).

As will be appreciated, the metal oxide coating leads to a passivation of the CNTs and may reduce the ability of the CNTs to trap organic molecules or to react with atomic oxygen or aggressive chemicals. Furthermore, the metal oxide claddings increase the mechanical stability of the CNT layer and make it more resistant against mechanical stress. The claddings may be adjusted (in terms of chemical composition and thickness) to achieve a compromise between light absorption, mechanical stability and protection against reaction with oxygen or aggressive chemicals.

The CNTs of the carbon-nanotube-based composite are preferably non-aligned (i.e. entangled), thus forming an (isotropic) CNT thicket rather than a CNT forest (aligned CNTs). With regard to the application of the CNT-based composite coating as a black coating, the fact that the CNTs are not aligned ensures that no direction of the incident light is privileged or special, yielding Lambertian or nearly Lambertian reflection behaviour.

Preferably, the CNTs have an average diameter in the range from 0.3 to 150 nm, more preferably in the range from 0.3 to 20 nm.

The metal oxide claddings preferably comprise or consist of MgO.

According to a preferred embodiment of the invention, the carbon-nanotube-based composite coating comprises a ceramic cap layer atop the thicket of sheathed carbon nanotubes. The ceramic cap layer may be conformal with the carbon nanotubes, leaving the individual capped sheathed CNTs visible by (scanning electron) microscopy. That is the case if a thin cap layer is applied, where the thickness of the cap layer is of the same order of magnitude as the diameter of the sheathed CNTs). Alternatively, the cap layer may be applied such that it substantially fills the interstices between the sheathed CNTs at least in a top region thereof, leading to a substantially continuous solid capping layer.

The ceramic cap layer preferably consists of a different material than the metal oxide claddings. The ceramic cap layer may e.g. consist of a material selected from the group comprising or consisting of $Al_2O_3$, $Si_2O$, $Si_3N_4$, $SiO_xN_x$, AlN, AlNO, MgO, ZnO, $SnO_2$, NiO, $ZrO_2$, $Cr_2O_3$, $MoO_2$, $RuO_2$, $CoO_x$, $CuO_x$, $VO_x$, $FeO_x$, $MnO_x$, $TiO_2$, $CaF_2$, $BaF_2$, $MgF_2$, ternary and/or complex oxides involving one or more of the elemental species of the mentioned compounds and mixtures thereof.

A preferred aspect of the present invention relates to a black coating, preferably a matte black coating, more preferably a superblack coating, comprising a carbon-nanotube-based composite coating as described herein. In the context of the present document, the term "black" qualifies a surface with a total hemispherical reflectivity (THR) of no more than 5% over the entire wavelength range from 400 nm to 1 µm and for any incidence angle (angle between the surface and the incoming beam) greater than 20°. A "matte" surface is a surface, whose reflectivity in the specular direction amounts to no more than 5% of the THR, for any incidence angle greater than 20°. As used herein, a "superblack" surface is a matte black surface having, over the entire wavelength range from 400 nm to 2.5 µm, a total hemispherical reflectivity (THR) of no more than 1% around normal incidence (incidence angle 20°) and no more than 10% for grazing incidence (incidence angle <20°).

As will be appreciated, a black coating consisting of the carbon-nanotube-based composite coating of the present invention offers good absorptance and can be tuned to meet the requirements of a superblack coating. Furthermore, Lambertian reflection behavior can be achieved. The carbon-nanotube-based composite coating is suitable for heat radiation (emittance) and can thus be used in thermal elements and on baffles, vanes or optical elements that need that type of cooling. The carbon-nanotube-based composite coating is compatible with different kinds of substrates, it can be produced with any desired thickness in the range from 50 nm to 5000 µm. The surface density (mass per unit area) is compatible with most applications. As the fabrication process of the carbon-nanotube-based composite coating uses chemical vapor deposition (CVD), which involves deposition at elevated temperatures and which may be carried out at low pressures, conditions that are unfavourable for the incorporation of volatile organic molecules or water into the coating, outgassing is not an important issue with the carbon-nanotube-based composite coating. That point is especially advantageous for space and high-vacuum applications. The encapsulation of the CNTs prevents the absorption of humidity and organic molecules along the post-deposition handling, processing, storage, assembling and repair. Another advantage of the carbon-nanotu be-based composite coating is its ability to withstand direct sun illumination or, more generally speaking, intense radiation without alteration. Last but not least, chemical inertness of carbon-nanotube-based composite coating is an advantage (e.g. low sensitivity to atomic oxygen) appreciated in many applications.

A further aspect of the present invention relates to a method for producing carbon nanotubes by CVD. As used herein, "CVD" is intended to include different formats of CVD, such as, e.g., metalorganic CVD (MOCVD), atomic layer deposition (ALD), pulsed-spray evaporation CVD, etc. Preferably, however, the CVD is carried out without using a plasma or radiation to enhance or initiate the growth of the CNTs and, if applicable, its metal oxide claddings. Plasma-enhanced CVD (PECVD) and photo-initiated CVD (PICVD) are thus preferably excluded. The method comprises:

providing, in a reaction chamber, a substrate with metal or metal carbide nanoparticles on its surface or a mixture thereof, the nanoparticles comprising a first, CNT-growth-catalysing, metal species selected from the group comprising or consisting of Fe, Co, Ni;

introducing an inorganic, metalorganic or organometallic precursor into the reaction chamber, together with a precursor for CNTs, the metalorganic or organometallic precursor selected for the deposition of a second metal;

growing CNTs from the precursor for CNTs, the second metal obtained from the inorganic, metalorganic or organometallic precursor enhancing CNT-growth-catalysing activity of the first metal.

Preferably, the precursor for CNTs comprises a hydrocarbon, alcohol being most preferred. Other possible but somewhat less preferred precursors for the CNTs are aldehydes, thiols, amines, and ethers. The precursor for CNTs may serve as a solvent for the precursors selected for the deposition of the first and/or the second metal, in which case the precursor solution serves as the feedstock for both the CNT growth and as an organic reducing agent for the deposition of the first and/or the second metal. Alternatively, the precursor for the CNTs and the precursors for the first and/or the second metal are introduced from different sources.

Preferably, the second metal forms an alloy phase with the first metal, the alloy phase causing the enhanced CNT-growth-catalysing activity. To the best knowledge of the inventor, the use of Mg-based alloys or carbide compounds involving Fe, Co or Ni as CNT growth catalysts has never been reported in the literature. It is the inventor's merit to have recognized that the growth of CNTs can be carried out at significantly lower temperatures without having to resort to plasma enhancement or photo-initiation. While CNT growth typically requires a substrate temperature above 800° C. (if no plasma or light is used as an additional energy source), the growth of the CNTs according to a preferred embodiment of the present invention is carried out in the temperature range from 300 to 600° C., more preferably in the temperature range from 350° C. to 500° C., and even more preferably in the range from 350 to 450° C. As indicated above, the growth of the CNTs need no longer be plasma-induced or radiation-induced in these temperature ranges.

Preferably, upon deposition, the second metal forms a metal oxide cladding sheathing the CNTs.

The second metal is Mg, leading to the formation of MgO claddings around the CNTs. It is worthwhile noting that the growth of the claddings occurs concomitantly with the growth of the CNTs. Accordingly, the degree of coverage of the CNTs by the claddings can be adjusted and modulated by controlling the amounts of the precursors delivered into the reaction chamber during the growth phase.

The method may comprise depositing a ceramic cap layer atop the CNTs.

Such cap layer may e.g. consist of a material selected from the group comprising or consisting of $Al_2O_3$, $Si_2O$, $Si_3N_4$, $MgF_2$, $SiO_xN_x$, AlN, AlNO, MgO, ZnO, $SnO_2$, NiO, $ZrO_2$, $Cr_2O_3$, $MoO_2$, $RuO_2$, $CoO_x$, $CuO_x$, $VO_x$, $FeO_x$, $MnO_x$, $TiO_2$, $CaF_2$, $BaF_2$, ternary and/or complex oxides involving one or more elemental species of the mentioned compounds, and mixtures thereof.

The metal nanoparticles are preferably deposited from an inorganic, metalorganic or organometallic precursors for the first metal. Inorganic precursors for the first or the second metal may e.g. be halides, carbonyls, nitrates, etc. Metalorganic or organometallic precursors are, however, preferred, as they are typically less toxic and corrosive and have lesser demands regarding recovery and disposal of reaction products.

According to a preferred embodiment of the method, pulsed spray evaporation CVD is used to deposit the metal and/or metal carbide nanoparticles, to grow the CNTs and, if applicable, the metal oxide claddings. The metal and/or metal carbide nanoparticles are preferably deposited from a first precursor solution comprising a metalorganic or organometallic precursor for the first metal dissolved in a solvent (preferably an organic solvent such as, e.g. an alcohol or an aldehyde), the second metal being deposited from a second precursor solution containing the metalorganic or organometallic precursor selected for the deposition of the second metal dissolved in alcohol serving as the precursor for the CNTs.

According to a currently most preferred implementation of the method, the metalorganic precursor for the first metal comprises cobalt acetylacetonate and/or nickel acetylacetonate and/or iron acetylacetonate, and the metalorganic precursor selected for the deposition of the second metal comprises magnesium acetylacetonate.

As will be appreciated, the CVD method described herein enables the growth of uniform films even on highly structured surfaces. The overall structure features a layer of highly entangled CNTs that are partially or totally sheathed with metal oxide claddings. The coated CNTs strongly absorb visible light because of the inter-band transition of the metal phase and the intrinsic absorption bands of the carbon phase. The scattering and absorption efficiencies can be manipulated through the adjustment of the size of the particles and the proportion of carbon to metal.

The proposed fabrication method may involve only moderate heating of the substrate (e.g. up to 500° C.) and thereby offers a great range of possibilities regarding the choice of the substrate. Aluminium parts or other metallic parts in a precise metallurgical state (that shall not be altered) could thus serve as substrates.

Another noteworthy advantage of the proposed method is that it is not a so-called line-of-sight process (where shadowing is a concern) and complex geometries may thus be coated. Complex three-dimensional parts (e.g. baffles with vanes, etc.) can thus be coated much more easily than in those processes.

A considerable degree of freedom is available to optimize the optical properties of the CNT-based coating, including:
Thickness
Degree of coverage of the CNTs by the metal oxide
Nature of the involved metal oxide
Presence or absence of a ceramic capping layer.

According to a preferred embodiment of the method, the precursor(s) of the first metal (hereinafter: the first precursor(s)) and the precursors of the second metal and the CNTs (hereinafter: the second precursors) are introduced into the reaction chamber at respective times, the reaction chamber being purged there between (e.g. by using a chemically inert gas like $N_2$ or the like), the introductions of the first precursor(s) and the second precursors being repeated plural times. The number of cycles may depend on several parameters, in particular the desired thickness, the degree of entanglement of the CNTs, the length of the CNTs, the duration of exposure of the substrate to each of the first and second precursors, the type of materials involved, etc. It is worthwhile noting that the first and second metal may form alloy, carbide compounds or metal-metal nanoparticles in the interstices between the coated CNTs. These nanoparticles may serve as starting points of further CNTs, leading to a ramified thicket of coated CNTs and nanoparticles.

BRIEF DESCRIPTION OF THE DRAWINGS

By way of example, preferred, non-limiting embodiments of the invention will now be described in detail with reference to the accompanying drawings, in which.

DETAILED DESCRIPTION OF ONE OR MORE PREFERRED EMBODIMENTS

Figure 1:
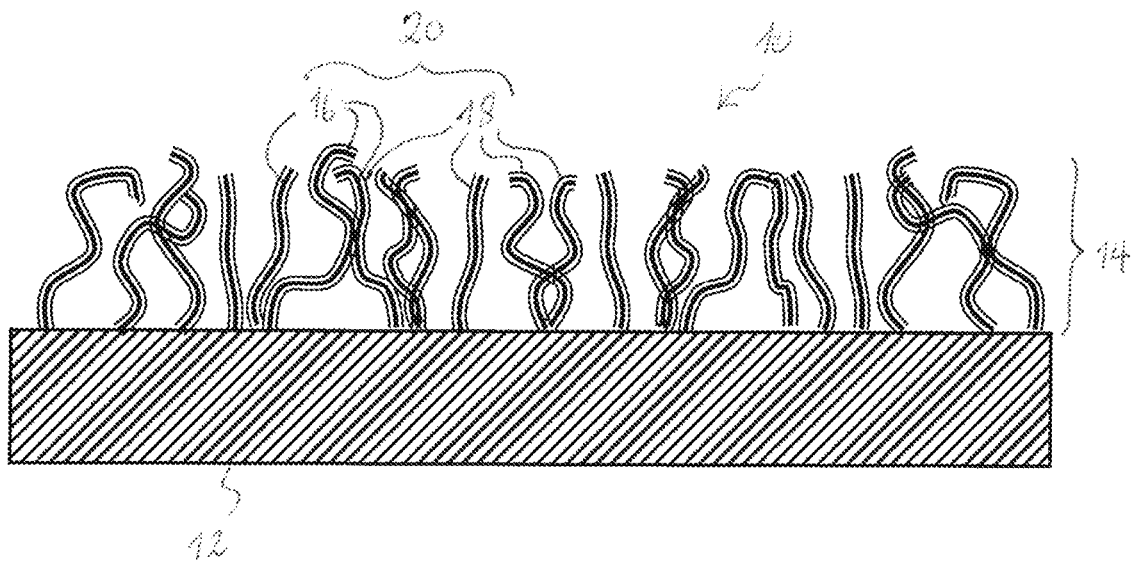
FIG. 1: is a cross-sectional schematic of a CNT-based coating comprising metal-oxide-sheathed CNTs.

A carbon-nanotube-based composite coating 10 according to a first preferred embodiment of the invention is schematically depicted in FIG. 1. The CNT-based composite coating 10 is applied as a black coating on substrate 12. It comprises a layer 14 of strongly entangled, non-aligned CNTs 16 that are individually covered with metal oxide claddings 18. The non-aligned coated CNTs 20 form a CNT thicket on the surface of the substrate 12. It is worthwhile noting that the CNT thicket may be much denser than shown in FIG. 1.

Figure 2:
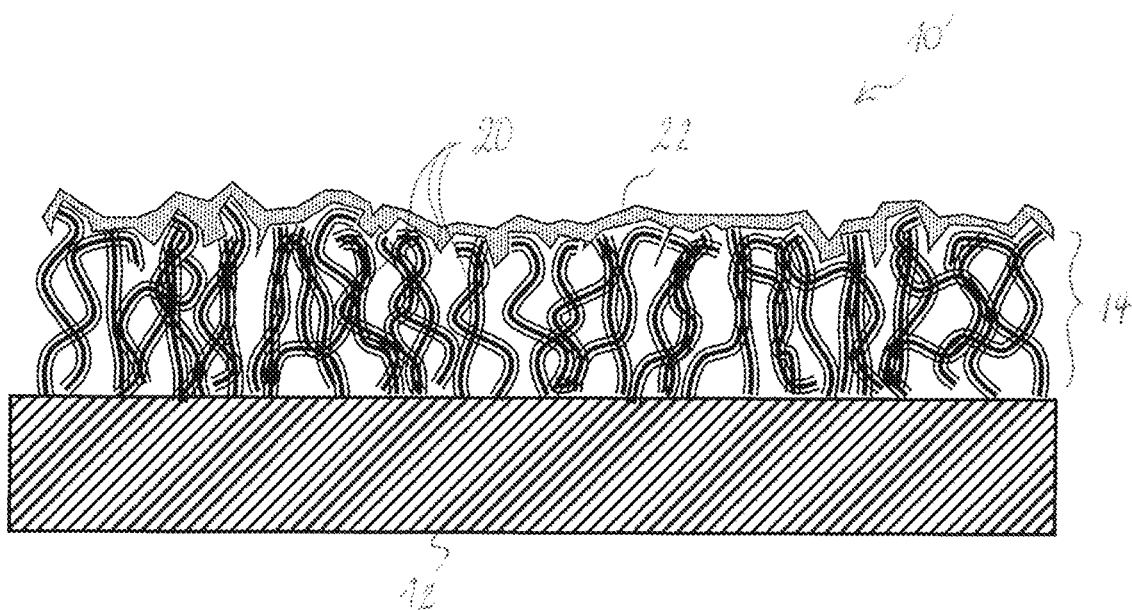
FIG. 2: is a cross-sectional schematic of a CNT-based coating as in FIG. 1 with a ceramic cap layer on top.
Figure 3:
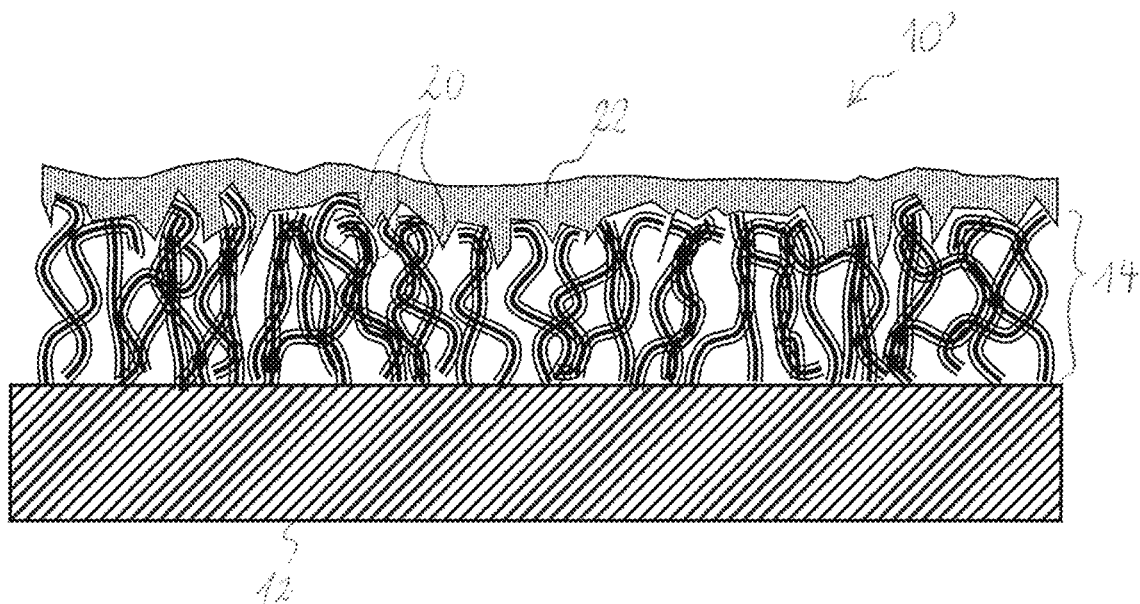
FIG. 3: is a cross-sectional schematic of a CNT-based coating as in FIG. 2 with a thicker ceramic cap layer on top.
Figure 13:
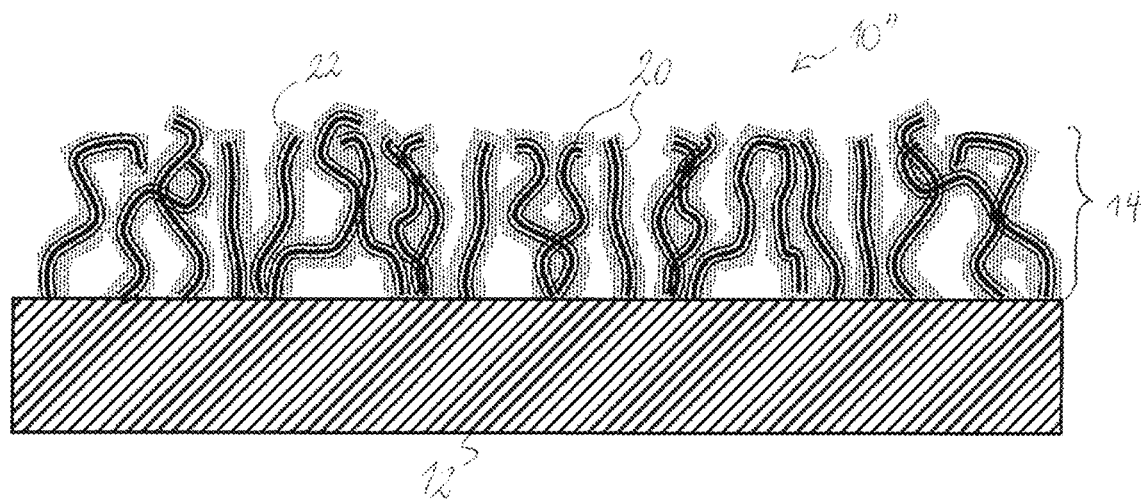
FIG. 13: is a cross-sectional schematic of a CNT-based coating with a porous ceramic cap infiltration of the layer of CNTs.
Figure 14:
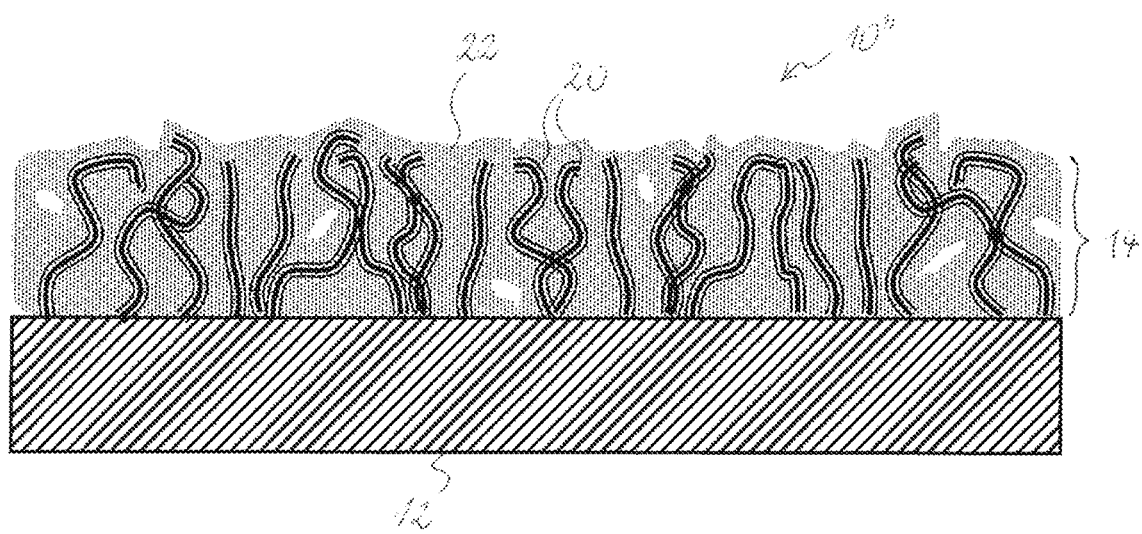
FIG. 14: is a cross-sectional schematic of a CNT-based coating with a relatively dense ceramic cap infiltration of the layer of CNTs.

FIGS. 2 and 3 shows a CNT-based composite coating 10' comprising a ceramic cap layer 22 atop the layer 14 of CNTs. The ceramic cap layer 22 is preferably deposited by CVD or ALD after the CNT growth has been terminated. When the ceramic cap layer 22 is very thin (i.e. of approximately the same thickness as the coated CNTs 20 or thinner), the ceramic cap layer may still be discontinuous or conformal to the CNTs. When the ceramic cap layer 22 grows thicker (see in particular FIG. 3) the islands of ceramic cap material on the tips of the CNTs join and begin to form continuous but still porous layer. Eventually, as the CVD or ALD growth of the ceramic cap layer goes on, more and more pores are filled with ceramic material, leading to a continuous overgrowth of the ceramic cap layer with little or no apparent pores. Depending on the deposition conditions, the species involved, etc., the ceramic capping material may substantially (e.g. completely) infiltrate the layer of carbon nanotubes, substantially filling up the interstices between the coated CNTs 20, thereby leading to the formation of a dense film (consisting of the thicket of coated CNTs surrounded by the capping material). A CNT-based composite coating 10" comprising a ceramic cap layer 22 infiltrating the layer 14 of CNTs is shown in FIGS. 13 and 14.

Figure 4:
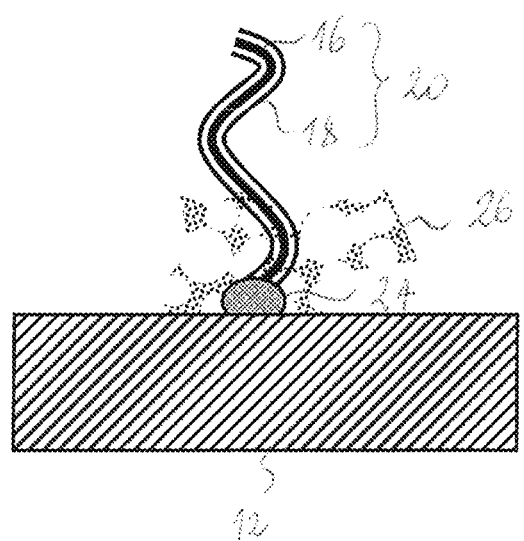
FIG. 4: is a schematic illustration of the so-called base-growth mechanism.
Figure 5:
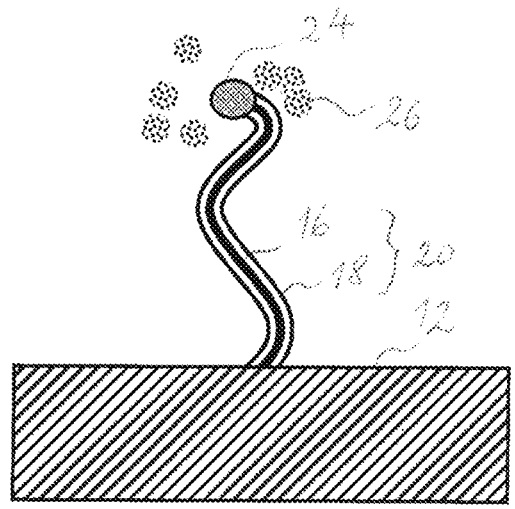
FIG. 5: is a schematic illustration of the so-called tip-growth mechanism.

FIGS. 4 and 5 illustrate two CNT growth mechanisms that may lead to the formation of metal-oxide-coated CNTs.

FIG. 4 illustrates the so-called base base-growth mechanism. A metal nanoparticle 24 on the surface of the substrate 12 dissociates the hydrocarbon molecules that serve as the precursors of the CNTs into a carbon and a hydrogen fraction. The hydrogen gas leaves the reaction zone, while the carbon is dissolved in the metal until the solubility limit is reached. As from that point, the carbon crystallises out in the form of a CNT on the face of the nanoparticle turned away from the substrate. While the CNT grows, the nanoparticle remains in contact with the substrate.

FIG. 5 illustrates the so-called tip-growth mechanism. In that case, the carbon crystallised out as a CNT on the interface between the nanoparticle 24 and the substrate, causing the nanoparticle 24 to lift off and to remain at the tip of the CNT as growth thereof goes on.

According to the method proposed in the context of the present invention, the metal and/or metal carbide nanoparticles 24 comprise CNT-growth-catalysing metal and/or metal carbide involving elements selected from Fe, Co and Ni (or mixtures thereof). A second metal species, preferably Mg, is provided from a metalorganic or organometallic precursor, in parallel with the hydrocarbon (preferably alcohol) molecules that serve as the feedstock for the CNT growth. In both FIGS. 4 and 5, the precursors of the CNTs and the second metal are represented as precursor vapour 26.

It is currently believed that the exposure of the metal nanoparticles to the precursor for the second metal and the CNT feedstock molecule drives the following scenarios:

The metal species from the inorganic, metalorganic or organometallic precursor for the second metal forms an alloys or carbide compound with the Fe, Co and/or Ni containing phases already present as nanoparticles on the growth surface. In case of cobalt as the first metal and Mg as the second metal, $CoMg_2$, $MgCo_2$, or $MgCo_3C_{0.5}$ are likely to be obtained.

The CNT feedstock molecule is decomposed on the surface of the nanoparticles modified by the second metal and the carbon crystallises out in the form of a single- or multi-walled CNT.

The inorganic, metalorganic or organometallic precursor for the second metal decomposes on the surface of the nanoparticle to yield metal oxide deposit.

It is observed that the presence of the second metal facilitates the formation of the CNTs at lower temperatures. Furthermore, a metal oxide cladding is formed that coats the CNT but does not hinder CNT growth. Regarding the reaction mechanisms, they have to be investigated further. Accordingly, the above scenarios shall be regarded as hypotheses to which the inventor does not intend to be bound. After further investigations, it may turn out that they do not accurately or not completely describe the enhanced CNT growth and/or the formation of metal oxide claddings thereon.

Notwithstanding that, the experimental results (see in examples 1 to 6 hereinafter) suggest that the three scenarios occur but in a given logic. The modification of the first metal phases (Fe, Co, Ni) by the precursor of the second metal ($Mg(acac)_2$ in the examples) seems to be the most favourable scenario from the kinetic point of view. The formed phases feature a stronger catalytic activity towards the growth of CNTs. As a consequence, the formation of CNTs is substantially enhanced. The growth of the metal oxide claddings occurs with more modest kinetics leading to coverage of the CNTs without hindering their growth.

The fraction of each phase in the CNT-based composite coating (i.e. the CNT phase, the metal oxide cladding phase and the alloy phase of the modified nanoparticles) can be adjusted by controlling the delivery recipe.

Figure 6:
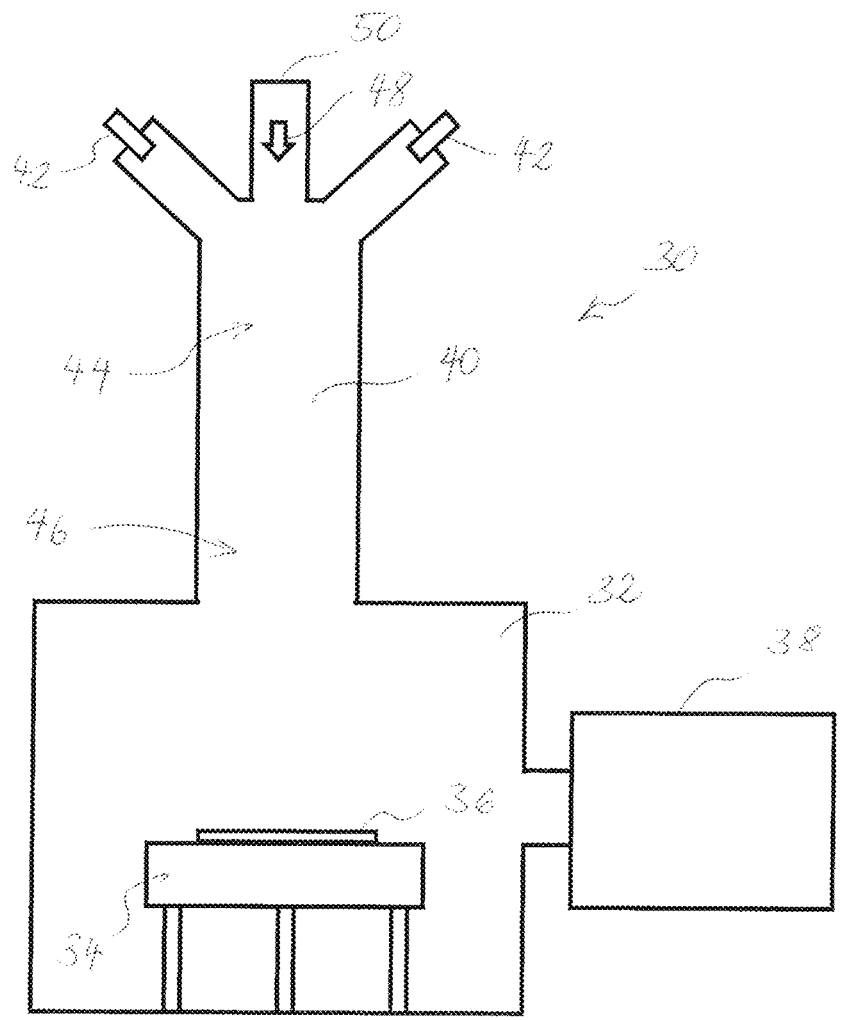
FIG. 6: is a schematic drawing of a CVD reactor equipped for pulsed-spray evaporation CVD.

FIG. 6 illustrates a CVD reactor 30 for carrying out pulsed-spray evaporation CVD of a carbon-nanotube-based composite coating. The CVD reactor 30 comprises a main chamber 32 having arranged therein a substrate holder 34 with a substrate heater 36. The substrate (not shown in FIG. 4) may be placed on the substrate heater 36 by a manipulator (not shown). A vacuum pump 38 is connected to the main chamber 32, as well as a trap for the carrier gas (not shown). The precursors and the carrier gas may be introduced into the main chamber 32 through a tubular evaporation and transport chamber 40. The evaporation and transport chamber 40 is equipped with heaters (not shown) allowing it to be brought to sufficiently high temperatures for the evaporation of the precursor solutions and the transport of the resulting vapour. The liquid precursor solutions are injected by respective injectors 42 into an evaporation zone 44 of the evaporation and transport chamber 40. In the evaporation zone 44, precursor vapours are then formed, which are transported by the carrier gas through a so-called transport zone 46 leading into the main chamber 32. The carrier gas (represented by arrow 48) may be introduced at a controlled flow rate through carrier gas inlet 50.

Figure 7:
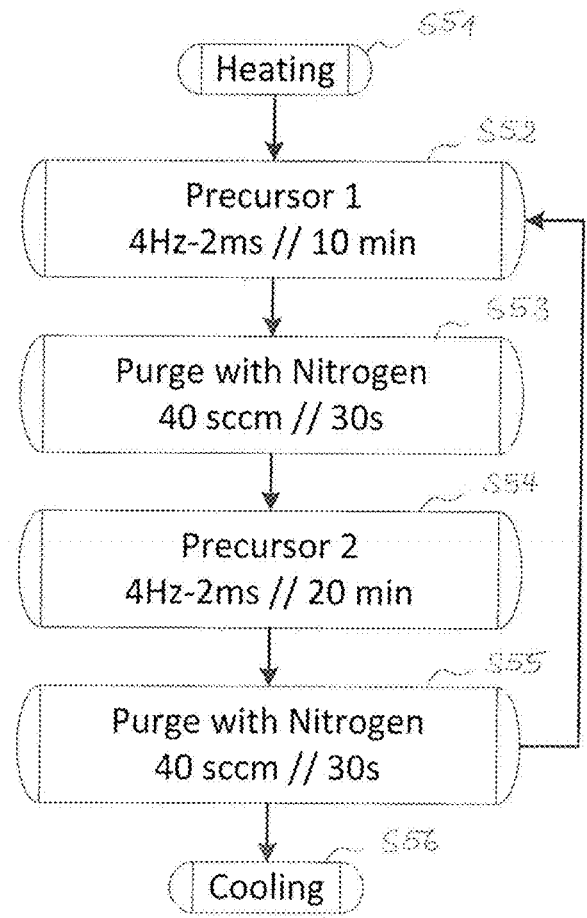
FIG. 7: is flow chart of an example of a pulsed-spray evaporation CVD process in accordance with a preferred embodiment of a method for growing oxide-coated CNTs.

FIG. 7 shows a flow chart illustrating pulsed-spray evaporation CVD (PSE-CVD) according to a preferred embodiment of the invention. The sequence used and the numerical values in FIG. 7 are illustrative only and may be varied depending on the composition of the coating to deposit. In a first step (S51), the various parts of the reactor that is used to produce a black CNT-based composite coating are heated to the desired temperatures. A first deposition phase of metal nanoparticles from a first precursors or a first group of precursors is then started. In the illustrated case, a first precursor solution containing the first precursor(s) is injected into the evaporation zone (step S52) at a predefined rate (4 Hz in the example) and with predefined opening times of the injector (2 ms for each injection in the example). The precursor vapour formed in the evaporation zone is transported by the carried gas into the main chamber of the reactor, where the ceramic matrix is deposited on the substrate. The injection regime of the first precursor solution is maintained for a predefined amount of time (10 minutes in the example), before the injections of the first precursor solution are stopped and the reactor is purged using the flux of carrier gas (step S53) during a first purge time (30 s with nitrogen in the illustrated example). A second precursor solution containing the precursors for the second metal (and thus for the metal oxide cladding) and for the CNTs is then injected into the evaporation zone (step S52) at a predefined rate (4 Hz in the example) and with predefined opening times of the injector (2 ms for each injection in the example). The vapour formed from the second precursors is transported into the main chamber, where coated CNTs are formed as illustrated in FIG. 4 or 5. The injection regime of the second precursor solution is maintained for a predefined amount of time (20 minutes in the illustrated example), whereupon the reactor is again purged. The deposition steps are repeated a certain number of times. The injection parameters may be varied in accordance with the desired deposition profile. It should also be noted that the last deposition step is not necessarily a coated CNT growth step but could be one of depositing a ceramic cap (using a third precursor solution). When the growth of the carbon-nanotube-based composite coating has completed, the reactor is cooled down and the grown samples are taken out of the reactor.

The growth process of FIG. 7 may be greatly varied depending on the desired end product and the chemistry involved. For instance, while it may be preferable for practical reasons to have all first precursors necessary for the deposition of the nanoparticles in one solution, separate precursor sources could also be used. The same holds for the second precursors. It is also possible to mix the precursors 1 and precursors 2 in the same solution feedstock.

The flux of the carrier gas may be held constant throughout the entire growth process. Alternatively, the flux of carrier gas could be varied so as to adjust or optimize the deposition conditions.

The temperature of the evaporation and transport chamber is also preferably held constant while the deposition goes on. If necessary or deemed advantageous, however, that parameter could also be changed over time. The same is true for the temperature of the substrate.

Example 1

A carbon-nanotube-based composite coating with CNTs coated with MgO claddings was grown using a CVD reactor of the Luxembourg Institute of Science and Technology (LIST), equipped with a PSE unit for the controlled injection of liquid feedstock. The precursors selected were metal acetylacetonates that are easy to handle, store and implement. These precursors are soluble in ethanol and a large number of other solvents. In this example, the first precursor solution (for the deposition of the CNT-growth catalysing nanoparticle) was a 5 mM (5 mmol/l) solution of cobalt acetylacetonate (Co(acac)$_2$) in ethanol. The second precursor solution (serving as feedstock for the coated CNTs) was a 5 mM solution of magnesium acetylacetonate (Mg(acac)$_2$) in ethanol. The precursor solutions were injected as pulsed sprays into an evaporation tube maintained at 220° C. under vacuum. The precursors' delivery was performed by 2 ms opening of the injector with a frequency of 4 Hz, which yielding respective feeding rates of 2.5 ml/min. The carrier gas was nitrogen introduced with a flow rate of 40 sccm (standard cubic centimetres per minute) maintained constant through the entire deposition process.

The deposition conditions are summarised in the following table:

| | |
|---|---|
| Pressure during deposition | 5 mbar |
| Carrier gas: nitrogen | 40 sccm |
| Precursor 1: Co(acac)$_2$ in ethanol | 0.005 mol/l |
| Delivery of the precursor 1 | 4 Hz, 2 ms opening time |
| Precursor 2: Mg(acac)$_2$ in ethanol | 0.005 mol/l |
| Delivery of the precursor 2 | 4 Hz, 2 ms opening time |
| Temperature of evaporation and transport | 220° C. |
| Deposition temperature | 350° C. |

The deposition cycle was the following:
1. Precursor solution 1 during 10 minutes
2. Purge with nitrogen during 30 s,
3. Precursor solution 2 during 20 minutes,
4. Purge with nitrogen during 30 s.

The deposition cycle was carried out 5 times, followed by a final deposition of precursor solution 2. After the total deposition time of 175 minutes, a film thickness of 1.2 μm was reached, which corresponded to an average growth rate of 6.8 nm/min.

The CNT-based composite coating according to example 1 had an Mg/Co atomic ratio of 0.62, which was measured by EDX (Energy-dispersive X-ray analysis).

In a comparative experiment, it was shown that the cobalt nanoparticles deposited in the same conditions as in example 1 catalysed the growth of carbon nanotubes after a reducing heat treatment and exposure to acetylene-hydrogen at temperatures far exceeding 500° C. It was found that the growth rate of CNTs in the absence of magnesium was marginal below 600° C., which is clear evidence for the enhancement of the CNT-growth catalysing activity by the addition of Mg.

Example 2

A carbon-nanotube-based composite coating with CNTs coated with MgO claddings was grown using the same deposition conditions as in example 1, with the sole exception that the substrate temperature was set to 400° C. After the total deposition time of 175 minutes, a film thickness of 7.03 μm was reached, which corresponded to an average growth rate of 40.2 nm/min.

Example 3

A carbon-nanotube-based composite coating with CNTs coated with MgO claddings was grown using the same deposition conditions as in examples 1 and 2, with the sole exception that the substrate temperature was set to 450° C. After the total deposition time of 175 minutes, a film thickness of 11.5 µm was reached, which corresponded to an average growth rate of 69.7 nm/min.

Figure 8:
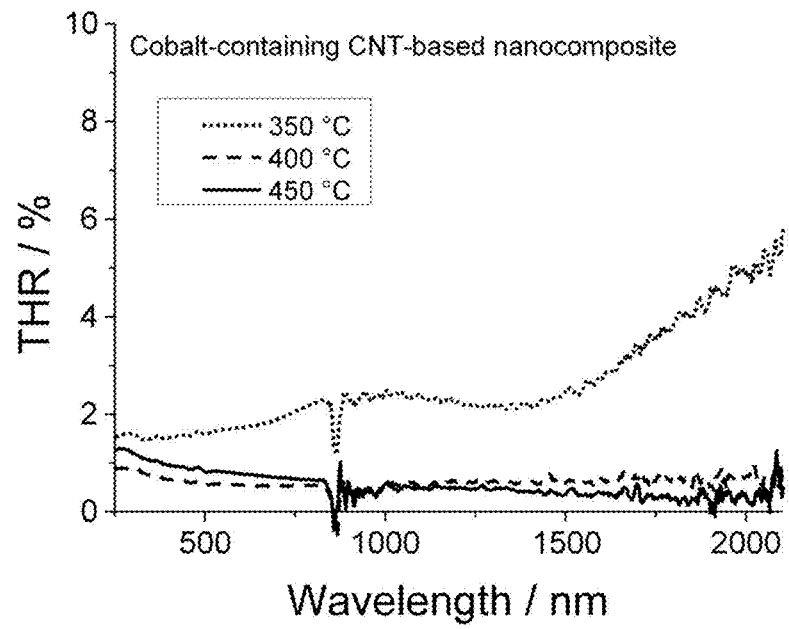
FIG. 8: is a diagram comparing the total hemispherical reflectivity of the coatings described as examples 1 to 3.

Examples 1 to 3 suggest that the growth rate in this limited range (350-450° C.) using separate precursors delivery (cobalt and magnesium acetylacetonate) linearly depends on the deposition temperature. The total hemispherical reflectivity (THR) of the three obtained coatings was evaluated in the spectral range from 250 nm to 2300 nm for an incidence angle of 8° (diffuse and specular reflections were integrated). The results are displayed in FIG. 8. All obtained CNT films feature a very low reflection in the UV-Vis-NIR spectral range. At the first glance, the film obtained at 350° C. exhibits lower optical performance since a somehow higher reflectance is measured. Nevertheless, it should be highlighted that the film of example 1, obtained at 350° C. is 10 times thinner than the film of example 3, which was grown at 450° C.

Integration of the THR over the 250-2300 nm spectral range yields a reflectance of 2.47% for the film obtained at 350° C., a reflectance of 0.6% for the film obtained at 400° C. and a reflectance of 0.55% for the film obtained at 450° C.

Figure 9:
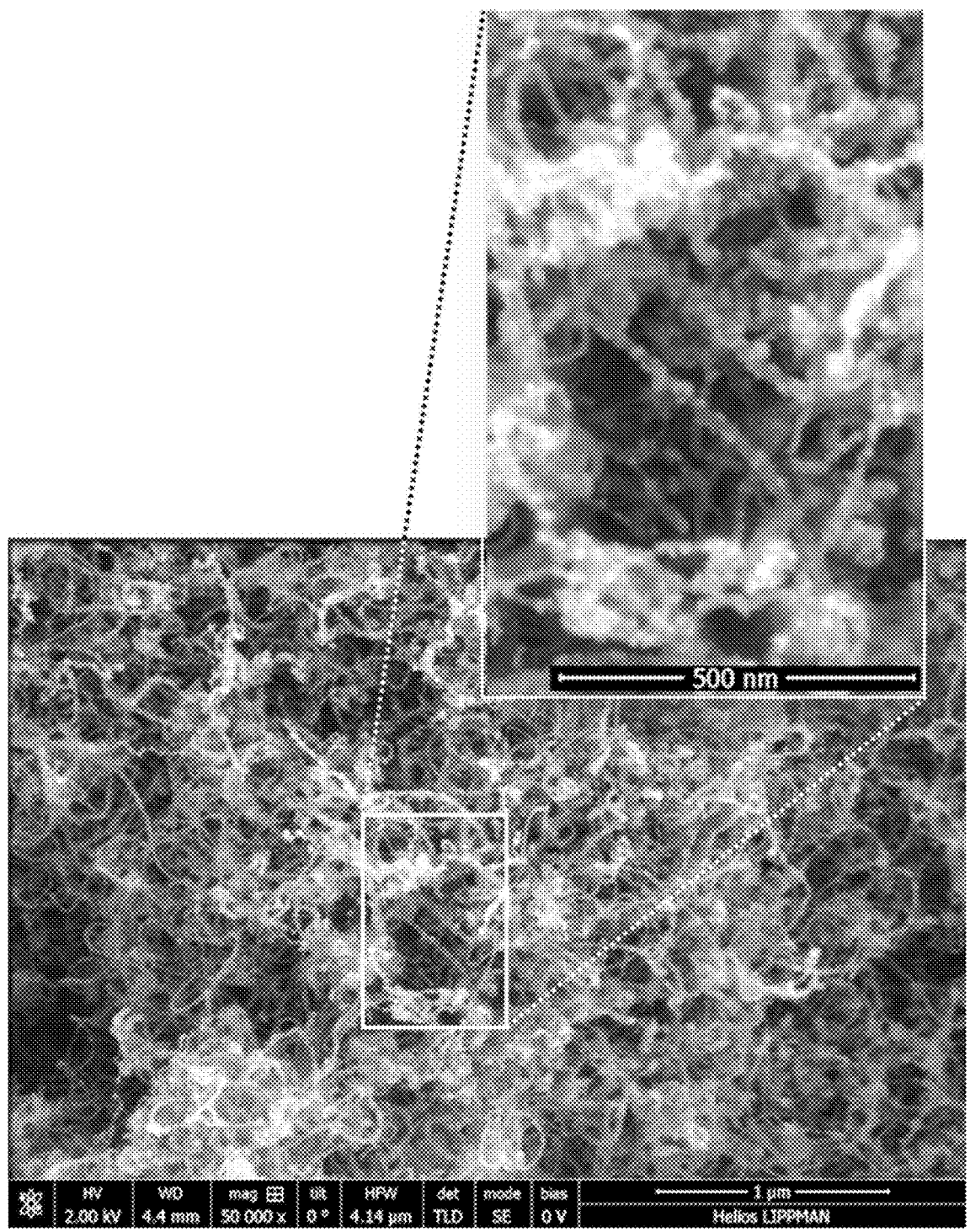
FIG. 9: is a scanning electron micrograph (SEM) of a CNT-based coating according to a preferred embodiment of the invention.

FIG. 9 shows a scanning electron micrograph of the coating obtained in example 1. The thicket of CNTs is clearly visible. The CNTs appear rough and of irregular diameter, which is due to the cladding of MgO sheathing the CNTs.

Example 4

A carbon-nanotube-based composite coating with CNTs coated with MgO claddings was grown using the same deposition conditions as in example 3, with the exception that the first precursor was Ni(acac)$_2$. After a total deposition time of 206 minutes, a film thickness of 5 µm was reached, which corresponded to an average growth rate of 24.27 nm/min. The integrated total hemispherical reflection over the 300-2300 nm spectral range was measured at 0.54%. The CNT-based composite coating according to example 4 had an Mg/Ni atomic ratio of 0.38, which was measured by EDX.

Example 5

A carbon-nanotube-based composite coating with CNTs coated with MgO claddings was grown using the same deposition conditions as in example 3, with the exception that the precursor 1 and precursor 2 were physically mixed (feedstock was ethanol with 2.5 mM of Mg(acac)$_2$ and 2.5 mM of Co(acac)$_2$). After a total deposition time of 120 minutes, the films featured an integrated total hemispherical reflection over the 300-2300 nm spectral range as low as 0.35%.

Example 6

A carbon-nanotube-based composite coating according to example 3 above was capped with a 20 nm thick conformal Al$_2$O$_3$ layer. This layer was applied at 120° C. (substrate temperature) and 3 mbar pressure using the following deposition cycle:
1. Exposure of the CNTs to trimethylaluminum (TMA) during 200 ms
2. Purge with nitrogen (flow rate of 350 sccm) during 2 s,
3. Exposure of the CNTs to water vapour during 200 ms
4. Purge with nitrogen (flow rate of 350 sccm) during 2 s, Steps 1 to 4 were carried out 125 times. The purges with nitrogen were implemented to prevent parasitic CVD reactions.

Figure 10:
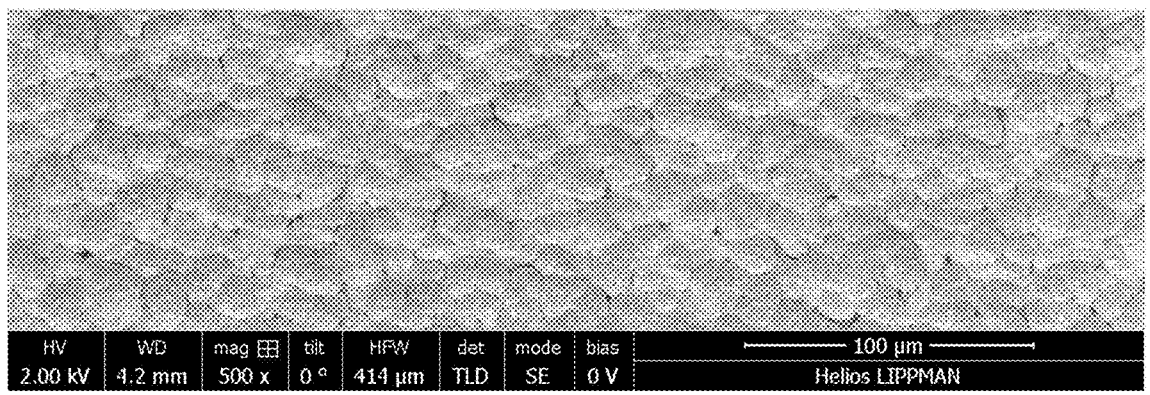
FIG. 10: is a top view SEM of a CNT-based composite coating capped with an $Al_2O_3$ layer.
Figure 11:
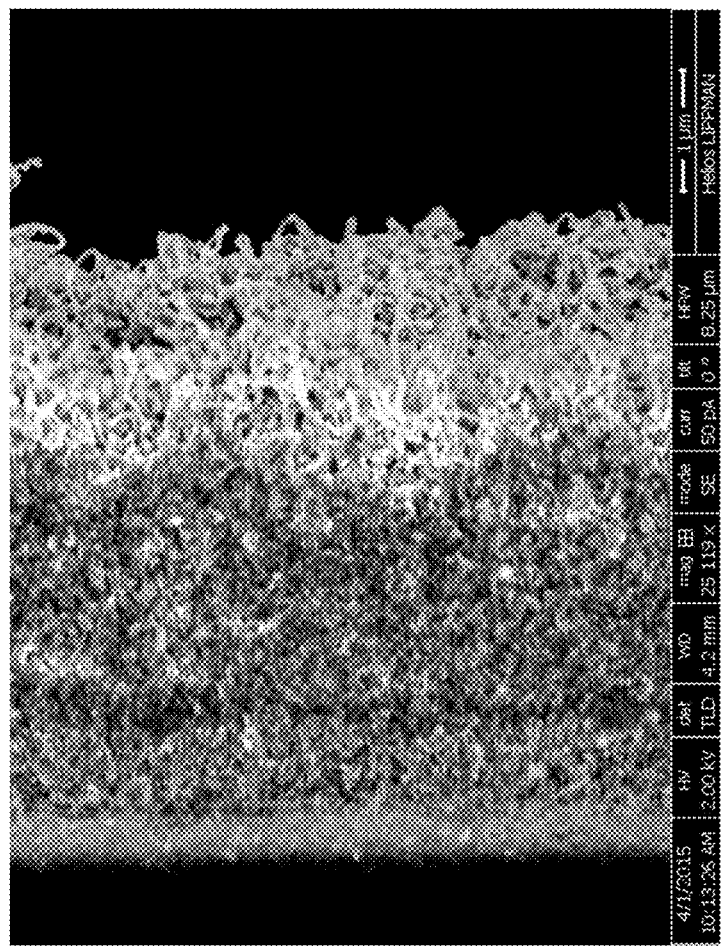
FIG. 11: is a cross sectional view SEM of a CNT-based composite coating capped with an $Al_2O_3$ layer.
Figure 12:
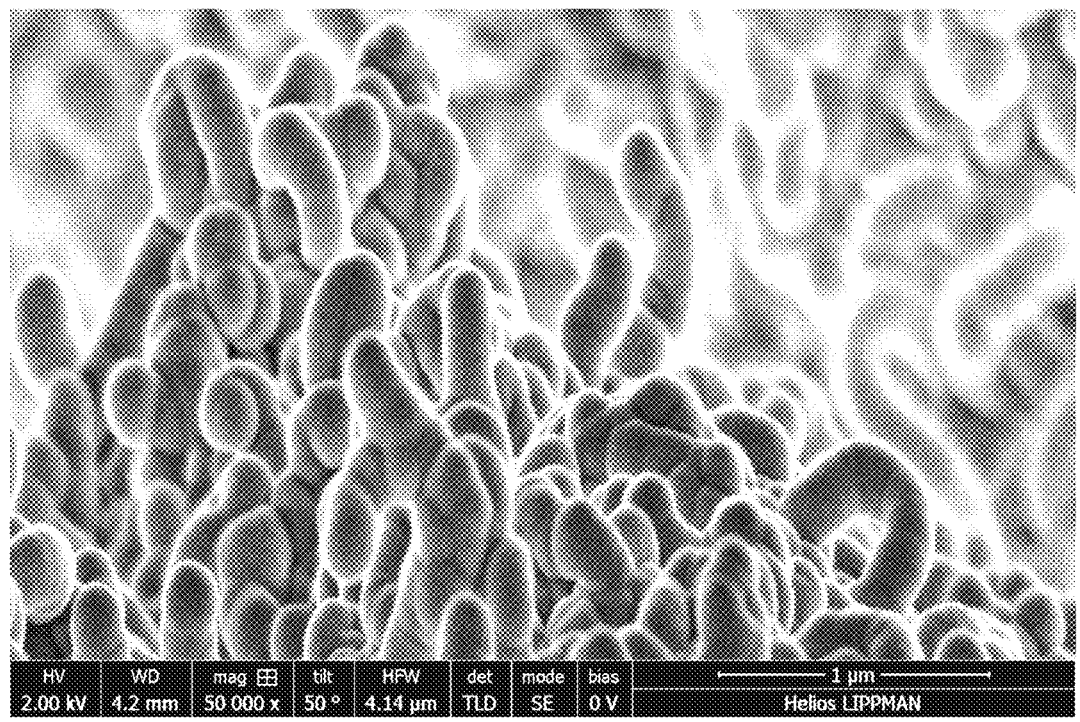
FIG. 12: is a close up of the capped tips of the CNTs of FIG. 11.

FIG. 10 shows a SEM of the surface obtained (top view) in example 4. FIG. 11 is a cross sectional SEM of the CNT-based composite coating capped with the Al$_2$O$_3$ layer. FIG. 12 is a close up of the tips of the CNTs coated with the Al$_2$O$_3$ layer.

Capping the CNT-based composite coating inherently changes the optical performance. The deposition of the alumina layer (20 nm) yielded an increase of the reflectance in the UV-Vis-NIR from 0.55% (example 3) to 1.1% (example 4). It is worthwhile noting that this reflectance is still exceptionally low despite use of an oxide with relatively high refractive index as the cap layer. Further improvements in terms of low reflectance are expected if SiO$_2$ or MgF$_2$ is used for capping the coated CNTs. It was observed that the deposition of up to 80 nm SiO$_2$ induced a marginal change of the THR. The integrated total hemispherical reflection over the 300-2300 nm spectral range was measured at 0.69%, 0.66%, 0.79% and 0.89% for SiO$_2$ capping layer thicknesses of 20 nm, 37 nm, 80 nm and 200 nm, respectively.

While specific embodiments have been described herein in detail, those skilled in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

The invention claimed is:
1. A carbon-nanotube-based composite coating on a substrate, the carbon-nanotube-based composite coating comprising a layer of non-aligned carbon nanotubes, the non-aligned carbon nanotubes obtained by CVD-growth on said substrate, the carbon nanotubes comprising metal oxide claddings that sheathe the carbon nanotubes.
2. The carbon-nanotube-based composite coating as claimed in claim 1, wherein the carbon nanotubes have an average diameter in the range from 0.3 to 150 nm.
3. The carbon-nanotube-based composite coating as claimed in claim 1, wherein the metal oxide claddings comprise or consist of MgO.
4. The carbon-nanotube-based composite coating as claimed in claim 1, comprising a ceramic cap as a layer atop said sheathed carbon nanotubes and/or as an infiltration in said layer of carbon nanotubes.
5. The carbon-nanotube-based composite coating as claimed in claim 4, wherein the ceramic cap layer consists of a different material than said metal oxide claddings.
6. The carbon-nanotube-based composite coating as claimed in claim 4, wherein said ceramic cap layer consists of a material selected from the group comprising Al$_2$O$_3$, Si$_2$O, Si$_3$N$_4$, MgF$_2$, SiO$_x$N$_x$, AlN, AlNO, MgO, ZnO, SnO$_2$, NiO, ZrO$_2$, Cr$_2$O$_3$, MoO$_2$, RuO$_2$, CoO$_x$, CuO$_x$, VO$_x$, FeO$_x$, MnO$_x$, TiO$_2$, CaF$_2$, BaF$_2$, ternary and complex oxides involving one or more elemental species of the foregoing, and mixtures thereof.
7. The carbon-nanotube-based composite coating as claimed in claim 1, wherein the carbon-nanotube-based composite coating is an optical black coating.
8. The carbon-nanotube-based composite coating as claimed in claim 1, wherein the carbon-nanotube-based composite coating is an optical black coating having a total hemispherical reflectivity of no more than 5% over the wavelength range from 400 nm to 1 μm for any incidence angle greater than 20°.

9. The carbon-nanotube-based composite coating as claimed in claim 1, wherein the metal oxide claddings sheathe the carbon nanotubes on their full lengths or along sections thereof.

10. A substrate comprising a carbon-nanotube-based composite coating thereon, wherein the carbon-nanotube-based composite coating comprises a layer of non-aligned carbon nanotubes CVD-grown on said substrate and wherein the carbon nanotubes comprise metal oxide claddings that sheathe the carbon nanotubes.

11. The substrate as claimed in claim 10, wherein the metal oxide claddings sheathe the carbon nanotubes on their full lengths or along sections thereof.

12. The substrate as claimed in claim 10, wherein the carbon nanotubes have an average diameter in the range from 0.3 to 150 nm.

13. The substrate as claimed in claim 1, comprising a ceramic cap as a layer atop said sheathed carbon nanotubes and/or as an infiltration in said layer of carbon nanotubes.

14. The substrate as claimed in claim 13, wherein the ceramic cap layer consists of a different material than said metal oxide claddings and wherein said ceramic cap layer consists of a material selected from the group comprising $Al_2O_3$, $Si_2O$, $Si_3N_4$, $MgF_2$, $SiO_xN_x$, AlN, AlNO, MgO, ZnO, $SnO_2$, NiO, $ZrO_2$, $Cr_2O_3$, $MoO_2$, $RuO_2$, $CoO_x$, $CuO_x$, $VO_x$, $FeO_x$, $MnO_x$, $TiO_2$, $CaF_2$, $BaF_2$, ternary and complex oxides involving one or more elemental species of the foregoing, and mixtures thereof.

15. The substrate as claimed in claim 10, wherein the carbon-nanotube-based composite coating is an optical black coating having a total hemispherical reflectivity of no more than 5% over the wavelength range from 400 nm to 1 μm for any incidence angle greater than 20°.

16. A carbon-nanotube-based composite coating on a substrate, the carbon-nanotube-based composite coating comprising a layer of non-aligned carbon nanotubes, the non-aligned carbon nanotubes attached to said substrate with an end thereof, the carbon nanotubes comprising metal oxide claddings that sheathe the carbon nanotubes on their full lengths or along sections thereof.

17. The carbon-nanotube-based composite coating as claimed in claim 16, wherein the carbon nanotubes have an average diameter in the range from 0.3 to 150 nm, wherein the metal oxide claddings comprise or consist of MgO.

18. The carbon-nanotube-based composite coating as claimed in claim 16, comprising a ceramic cap as a layer atop said sheathed carbon nanotubes and/or as an infiltration in said layer of carbon nanotubes, and wherein the ceramic cap layer consists of a different material than said metal oxide claddings.

19. The carbon-nanotube-based composite coating as claimed in claim 4, wherein said ceramic cap layer consists of a material selected from the group comprising $Al_2O_3$, $Si_2O$, $Si_3N_4$, $MgF_2$, $SiO_xN_x$, AlN, AlNO, MgO, ZnO, $SnO_2$, NiO, $ZrO_2$, $Cr_2O_3$, $MoO_2$, $RuO_2$, $CoO_x$, $CuO_x$, $VO_x$, $FeO_x$, $MnO_x$, $TiO_2$, $CaF_2$, $BaF_2$, ternary and complex oxides involving one or more elemental species of the foregoing, and mixtures thereof.

* * * * *